(12) United States Patent
Van Sinderen et al.

(10) Patent No.: US 8,280,333 B2
(45) Date of Patent: Oct. 2, 2012

(54) HARMONIC REJECTION MIXER UNIT AND METHOD FOR PERFORMING A HARMONIC REJECTION MIXING

(75) Inventors: Jan Van Sinderen, Liempde (NL); Sebastien Amiot, Bieville-Beuville (FR); Leonardus H. M. Hesen, Hegelsom (NL)

(73) Assignee: NXP B.V., Eindhoven (NL)

( * ) Notice: Subject to any disclaimer, the term of this patent is extended or adjusted under 35 U.S.C. 154(b) by 284 days.

(21) Appl. No.: 12/671,734

(22) PCT Filed: Jul. 30, 2008

(86) PCT No.: PCT/IB2008/053057
§ 371 (c)(1),
(2), (4) Date: Feb. 23, 2010

(87) PCT Pub. No.: WO2009/019633
PCT Pub. Date: Feb. 12, 2009

(65) Prior Publication Data
US 2010/0283526 A1 Nov. 11, 2010

(30) Foreign Application Priority Data
Aug. 7, 2007 (EP) .................................. 07290983

(51) Int. Cl.
*H04B 1/10* (2006.01)
*H04K 3/00* (2006.01)
(52) U.S. Cl. .................... 455/285; 455/296; 455/326
(58) Field of Classification Search ............... 455/285, 455/295–296, 302, 326, 333; 327/113, 116
See application file for complete search history.

(56) References Cited

U.S. PATENT DOCUMENTS
2003/0087624 A1* 5/2003 Leenaerts ............... 455/323
(Continued)

FOREIGN PATENT DOCUMENTS
JP 06-078007 3/1994
(Continued)

OTHER PUBLICATIONS

Weldon, Jeffrey A., et al; "A 1.75 GHz Highly Integrated Narrow-Band CMOS Transmitter With Harmonic-Rejection Mixers" IEEE Journ. Solid State Circuits, vol. 36, No. 12; IEEE Service Center, Piscataway, NJ, US; Dec. 2001.

*Primary Examiner* — Lee Nguyen

(57) ABSTRACT

A harmonic rejection mixer unit is provided which comprises an input (RF), at least one harmonic rejection unit (HRU) with at least two transistor units (T3a, T3b; T4a, T4b) for multiplying an input signal from the input (RF) with a multiplication signal (ELO). The harmonic rejection mixer unit furthermore comprises a transistor control signal generating unit (GGU) for generating transistor control signals (GS1-GS4) for the at least two transistor units (T3a, T3b; T4a, T4b) of the at least one harmonic rejection unit (HRU) by deriving the transistor control signals (GS1-GS4) from a local oscillator signal (LO). The transistor control signals (GS3, GS4) for the at least two transistor units (T3a, T3b; T4a, T4b) are generated with a duty cycle of <50% and are generated such that the shape of the multiplication signal ELO) is achieved by a constructive summation of the output signals from the transistor units (T3a, T3b; T4a, T4b). The transistor control signals (GS1-GS4) are generated such that only a summation of output signals from the transistor units with the same sign or with zero is performed.

17 Claims, 11 Drawing Sheets

U.S. PATENT DOCUMENTS

| | | |
|---|---|---|
| 2004/0005869 A1 | 1/2004 | See et al. |
| 2005/0059376 A1 | 3/2005 | Davis |
| 2005/0215223 A1 | 9/2005 | Lin et al. |
| 2010/0120377 A1* | 5/2010 | He .................................. 455/77 |

FOREIGN PATENT DOCUMENTS

| | | |
|---|---|---|
| JP | 2005159587 A | 6/2005 |
| WO | 03/034602 A | 4/2003 |
| WO | 2005/064785 A1 | 7/2005 |

* cited by examiner

HARMONIC REJECTION MIXER UNIT AND METHOD FOR PERFORMING A HARMONIC REJECTION MIXING

FIELD OF THE INVENTION

The present invention relates to a harmonic rejection mixer unit and method of performing a harmonic rejection mixing.

BACKGROUND OF THE INVENTION

Typical conversion circuits or mixers multiply an input signal with a local oscillator LO signal. The multiplication can for example be performed by switching the currents to obtain a low noise and high linearity result.

Typical mixers like switching MOS mixer and a Gilbert cell mixer are depicted in FIG. 1. The switching MOS mixer comprises four MOS transistors TA, TB, TC, and TD. The transistors TA and TB are coupled to a first resistor $R_S$ and the transistors TC and TD are coupled to a second resistors $R_S$. The two resistors $R_S$ are coupled to an RF input of the mixer. Furthermore, an operational amplifier OP is coupled between the transistors TA, TB, TC and TD and an IF output. The transistors TA and the transistor TC are coupled to a first input of the operational amplifier OP while the transistors TB and TD are coupled to the second input of the operational amplifier. The gates of the transistor TA and TD are coupled together and the gates of the transistors TB and TC are coupled together. The local oscillator signal LO is applied as input to the gate terminals of the transistors. The mixing of the RF input signal with the LO signal is performed by switching the transistors TA, TB, TC, and TD.

FIG. 2 shows a basic representation of a square wave multiplication of an up-conversion mixer according to the prior art. The above-mentioned multiplication corresponds to a multiplication of the input signal with a local oscillator LO signal having a square wave (as depicted in FIG. 2), i.e. the harmonics of the square wave are also included in the multiplication. Therefore, several unwanted conversion or multiplication components may be present at the output of the mixer. Accordingly, for a down-conversion receiver with a basic balance switching mixer the required channel at an IF distance from the L0 frequency is down converted. However, additionally RF signals at IF distance from 3·LO, 5·LO, 7·LO, etc. are also converted.

Narrow-band receivers are designed with a RF selectivity which are arranged before the mixer for removing any signals which would otherwise be down-converted by the LO harmonics. On the other hand, wide-band receivers will require tracking filters or harmonic rejection mixers. A harmonic rejection mixer is used to suppress the down-conversion or up-conversion with some LO harmonics that would otherwise occur. Ideally, this could be performed by a linear multiplication as shown for an up-conversion mixer in FIG. 3. However, in general, a bad noise and a bad linearity performance is present. In principle, a harmonic rejection mixer can by used for an up-conversion (the output frequency is higher than the input frequency)) and for a down conversion (the output frequency is lower than the input frequency). In an up-conversion the harmonic rejection mixer can be used to prevent multiples of the harmonics.

In "A 1.75 GHz Highly Integrated Narrow-Band CMOS Transmitter With Harmonic-Rejection Mixers", IEEE Journ. Solid State Circuits, Vol. 36, No 12, December 2001, an alternative solution is shown, where the effective shape of the LO signal can be changed by combining a number of switching multipliers and time shifting the LO signals applied to each of the multipliers or their respective transistors.

US 2004/005869 discloses a further harmonic rejection mixer with a number of Gilbert cells.

US 2005/0059376 describes a method for frequency translation with harmonic suppression using mixer stages.

However, harmonic rejection mixers according to the prior art suffer from a bad noise performance as compared to basic switching mixers. Moreover, the number of transistors which have to be switched in harmonic rejection mixer is quite high. This also leads to a high local oscillator LO driver power (as the local oscillator circuit must be able to drive all transistors) and a large silicon area. Moreover, due to cross talk, the layout of these transistors is complex. Furthermore, calibration loops which are incorporated to improve the limited rejection during the conversion of the LO harmonics (due to a mismatch of capacitive and/or resistive parasitics) are highly complicated as several parameters have to be aligned.

SUMMARY OF THE INVENTION

It is therefore an object of the present invention to provide a harmonic rejection mixer unit which is simpler and less complex.

This object is solved by a harmonic rejection mixer unit according to claims 1 and 11 as well as by a method for performing a harmonic rejection mixing according to claim 15 or 16.

Therefore, a harmonic rejection mixer unit is provided. The harmonic rejection mixer unit comprises an input, at least one harmonic rejection unit with at least two transistor units for multiplying an input signal from the input with a multiplication signal. The harmonic rejection mixer unit furthermore comprises a transistor control signal generating unit for generating transistor control signals for the at least two transistor units of the at least one harmonic rejection unit by deriving the transistor control signals from a local oscillator signal. The transistor control signals for the at least two transistor units are generated with a duty cycle of <50% and are generated such that the shape of the multiplication signal is achieved by a constructive summation of the output signals from the transistor units. The transistor control signals are generated such that only a summation of output signals from the transistor units with the same sign or with zero is performed. Accordingly, a destructive summation of the signals can be avoided.

According to an aspect of the invention, a termination transistor unit is providing a termination for the at least two transistor units to a termination node, if the at least two transistor units are switched off. Accordingly, a proper termination of the circuits can be achieved for the case that both transistor units are switched off.

According to a further aspect of the invention, the transistor control signal generating unit is adapted to generate transistor control signals for the termination transistor units by deriving the transistor control signals from the local oscillator signal. The frequency of the transistor control signal is twice the frequency of the transistor control signals for the at least two transistor units.

According to a further aspect of the invention, at least one mixer unit is arranged in parallel to the at least one harmonic rejection unit. The mixer unit comprises at least two transistor units. The transistor control signals for the at least two transistor units of the mixer unit is generated by the transistor control signal generating unit and have a duty cycle of 50%. Here, a classical mixer can be incorporated into the harmonic rejection mixer.

According to still a further aspect of the invention, a conversion gain modulating means is provided, which is coupled in series with the at least one harmonic rejection unit. The conversion gain modulation mean comprises at least one conversion gain modulating unit for performing a voltage-to-current conversion and for modulating the gain of the voltage-to-current conversion. Accordingly, the conversion gain of the harmonic rejection mixer unit is modulated.

The invention also relates to a harmonic rejection mixer with an input and at least one mixer unit with at two transistor units for mixing an input signal from the input. The harmonic rejection mixer furthermore comprises a conversion gain modulating means coupled in series with the at least one mixer unit. The conversion gain modulating means comprises at least one conversion gain modulating unit for performing a voltage-to-current conversion and for modulating the gain of the voltage-to-current conversion. The harmonic rejection mixer furthermore comprises a transistor control signal generating unit for generating transistor control signals for the at least two transistor units by deriving the transistor control signals from the local oscillator signal.

According to an aspect of the invention, the conversion gain modulating unit comprises a first resistor coupled between the input and a first node, a second resistor coupled between the input and a second node, a transistor coupled in series with the first node, a transistor coupled in series with the second node. Furthermore, a termination transistor is coupled between the first node and a termination node and a further termination transistor is coupled between the second node and the termination node. The transistor control signals for the transistors are generated by the transistor control signal generating unit such that the gain of the voltage-to-current conversion performed by the voltage gain modulating means is modulated.

The invention also relates to a method for performing a harmonic rejection mixing. An input signal from the input is multiplied with a multiplication signal by at least one harmonic rejection unit with at least two transistor units. Transistor control signals for the at least two transistor units are generated by deriving the transistor control signals from a local oscillator signal by means of a transistor control signal generating unit. The transistor control signals are generated with a duty cycle of <50%. The transistor control signals are generated such that the shape of the multiplication signal is achieved by a constructive summation of the output signals from the transistor units. The transistor control signals are generated such that only summation of output signals from the transistor units with the same sign or with zero is performed.

The invention also relates to a method for performing a harmonic rejection mixing, where an input signal from the input is mixed by means of a mixer unit comprising at least two transistor units. A conversion gain modulation is performed by a conversion gain modulation means which is coupled in series with the at least one mixer unit. A voltage-to-current conversion is performed and the gain of the voltage-to-current conversion is modulated. Transistor control signals for the transistor units are generated by means of a transistor control signal generating unit by deriving the transistor control signals from a local oscillator signal.

Moreover, the invention relates to the understanding that for prior art harmonic rejection mixers several time-shifted driving signal (which are derived from the LO signal) with a duty cycle of 50% are applied to the mixer transistors. Typically, the output signal of the mixer unit (which can be a transistor pair in the mixer) can be square waves and an effective multiplication output signal is achieved if the square waves are added or summed. The input signal is multiplied with the multiplication signal. The result is a stepped signal shape that approaches a sine wave. It should be noted that the square waves do not correspond to the gate signals applied to the gates of the transistors in the circuit. In fact, the square wave corresponds to the multiplier output signal of one multiplier unit (which can be a transistor pair in the mixer). The combination of several multiplier signals leads to the effective multiplication shape. It should further be noted that each multiplier unit has a certain weight or conversion gain. The conversion gain of a multiplier unit will determine the height of one step in the effective multiplication shape. However, according to the prior art the effective multiplication signal is at least partly realized by signal cancellation, namely when a subtraction of the square waves occur. This can for example happen, when two square waves are negative while the third is positive. Although the signals are undergoing a destructive signal cancellation, the noise from the three mixers are not correlated and the noise performance is degraded.

The invention therefore relates to the idea to provide a harmonic rejection mixer, wherein the transistor control signals of the transistors are controlled such that an overall effective multiplication or the LO signal is achieved not by signal cancellation but by summing the output signals of LO units (which e.g. can be a transistor pair in the mixer). No signal cancellation is performed as it will not happen (by controlling the transistor control signal accordingly) that a part of the square waves to be summed are positive while another is negative. This can be performed by modulating the conversion gain of the mixer (e.g. by introducing a conversion gain modulation unit in series with the mixer) instead of arranging a number of multipliers in parallel to obtain a desired effective shape of the multiplication or the LO signal. Alternatively, the transistor control signals of a mixer with two transistor units or transistor pairs are derived from the multiplication or LO signal and are generated with a duty cycle of less than 50%. The transistor control signals are generated such that the output signal of the two transistor units or the two transistor pairs can be combined constructively without a destructive signal cancellation. Such a conversion circuit or mixer is advantageous as it requires less switching devices, i.e. less silicon area and less power. In addition, the noise performance can be improved as the low gain parts are not implemented by a signal cancellation. Furthermore, the mixer can be reconfigured for rejecting different sets of harmonics. Finally, the calibration can be performed more easily. The harmonic rejection mixer according to the invention can be used in an up-converter or in a down converter.

It should be noted that an advantage of the present invention is that the shape of the effective LO or multiplication signal (and therefore the conversion gain modulation) is not realized by signal cancellation.

Further aspects are defined in the dependent claims.

BRIEF DESCRIPTION OF THE DRAWINGS

Advantages and embodiments of the invention are now described in more detail with reference to the figures.

DETAILED DESCRIPTION OF EMBODIMENTS

Figure 4:
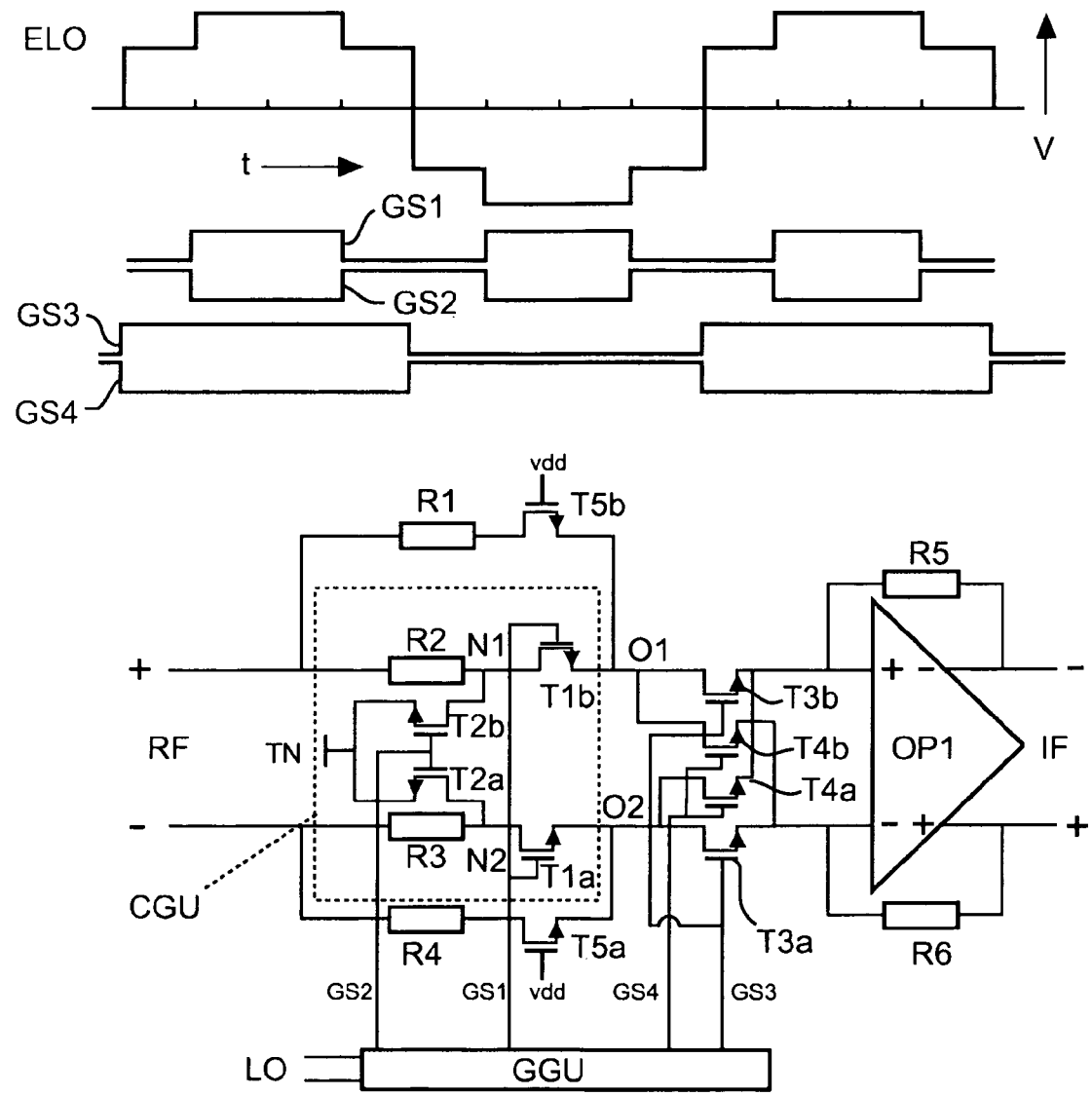
FIG. 4 shows a basic representation of a harmonic rejection mixer according to a first embodiment.

FIG. 4 shows a basic circuit diagram of a harmonic rejection mixer unit according to a first embodiment. In the upper part of FIG. 4, a diagram of gate signals GS1-GS4 and a resulting effective multiplication or local oscillator signal ELO of the harmonic rejection mixer is shown. The gate signals GS1-GS4 are derived from the local oscillator signal LO. The time period of the gate signal GS1 corresponds to the time period of the gate signal GS2 and is ½ of the time period of the LO or multiplication signal. However, the gate signal GS2 is inverted with respect to the gate signal GS1. The time period of the gate signal GS3 corresponds to the time period of the gate signal GS4 as well as to the time period of the LO signal. However, the gate signal GS4 is inverted with respect to the gate signal GS3.

The effective LO or multiplication signal described according to the present invention can be measured at the IF output, if a DC voltage is applied to a RF input. The effective LO or multiplication signal can also be measured by monitoring the currents at the input terminals of the operational amplifier. In other words the shape of the effective LO or multiplication signal can be considered as an amplitude modulation of the input signals. The signal at the input terminals of the operational amplifier OP1 corresponds to a multiplication of the RF input signal with the effective LO or multiplication shape. The effective LO or multiplication shape also describes the transfer from the RF input voltage signal to the currents entering the input terminals of the operational amplifier OP1. Therefore, the effective LO or the multiplication shape also describes the voltage-to-current conversion from the RF input to the input terminals of the operational amplifier.

The gate signals GS1-GS4 are derived from the LO signal in a gate signal generating unit GGC depicted in FIG. 4. The effective LO signal will be achieved by applying the gate signals GS1-GS4 to the respective transistors and by a weighting introduced by the respective resistors. Accordingly, the resistors (i.e. the resistor values) will determine how much each the output transistor pair driven by the gate signals is contributing to the effective LO or multiplication signal. The gate signals GS1-GS4 indicate the state of the MOS transistor switches T1-T4. If the MOS switch is ON the height or magnitude of the upper part of the effective LO signal is determined by the value of the resistors R2 in parallel with R1 and R3 in parallel with R4. The height of the base part of the effective LO signal is determined by the value of the resistors R1, R4. By changing the values of the resistors R5 and R6 the total gain can be varied. The transistors T5a, T5b are only introduced to improve the temperature compensation. It should be noted that the transistors T5a, T5b are optional and can be replaced by shorts. The basic multiplier is realized by the transistors T3a, T3b; T4a, T4b controlled by the gate signals GS3, GS4.

In the lower part of FIG. 4, a circuit diagram of the harmonic rejection mixer is depicted. In particular, a harmonic rejection MOS mixer for the $3^{rd}$ and $5^{th}$ harmonics is shown. The harmonic rejection mixer unit comprises a first input RF+ coupled to a second resistor R2 in series to a first node N1 and one first transistor T1b. A second input RF− is coupled to a third resistor R3 in series to a second node N2 and a further first transistor T1a. Two termination transistors T2a, T2b are coupled between the node N1 ground or a termination node TN and between a node N2 and ground or a termination node TN. The two first transistors T1a, T1b receive the first gate signals GS1 at their respective gates. The two termination transistors T2 receive the second gate signals GS2 at their respective gates. In parallel to the second resistor R2 and the first transistor T1, a first resistor R1 and one fifth transistor T5b are arranged. A fourth resistor R4 and a further fifth transistor T5a are arranged in parallel to the series connection of the third resistor R3 and the first transistor T1. The gates of the transistors T5a, T5b are coupled to the supply voltage vdd. The resistors R2, R3 and the transistors T1a, T1b; T2a, T2b form conversion gain modulation unit CGM which is used for modulating the conversion gain.

Figure 6:
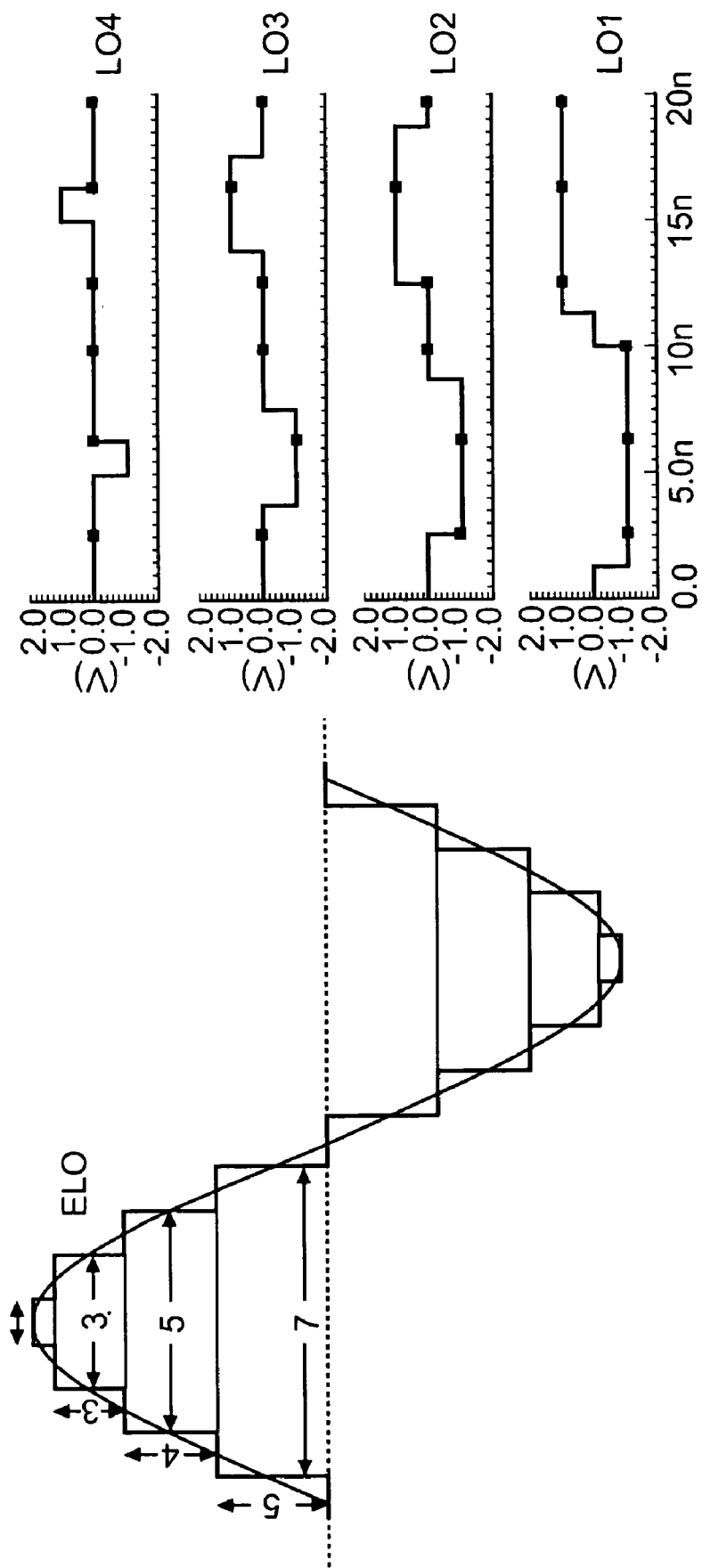
FIG. 6 shows a graph of an effective shape of the LO signal according to a third embodiment.

A gate signal generating, unit GGU is provided for generating the gate signals from the LO signal, i.e. the gate signals are derived from the LO signal, i.e. several conversion gain modulating units CGM can be arranged in parallel and form a conversion gain modulating means CGU. With the series solution multiple of conversion gain modulation units CGM can be placed in parallel forming a conversion gain modulation means, wherein each unit comprises a smaller duty cycle adding more steps in the effective LO shape e.g. as shown in FIG. 6.

The second resistor R2 is coupled to a positive RF input+ and the third resistor R3 is coupled to a negative RF input−. At the output 01, 02 of the conversion gain modulation unit CGM, four transistors T3a, T3b, T4a, T4b (i.e. the mixer) are arranged. Furthermore, an operational amplifier OH is arranged between the output of the fourth transistors T3a, T3b, T4a, T4b and the output IF. The first output terminal 01 of the harmonic rejection part is coupled to one third and one fourth transistor T3b, T4b. The second output O2 of the harmonic rejection unit is coupled to a further third transistor T3a and a further fourth transistor T4a. The one fourth transistor T4b is coupled to one third transistor T3a. The further fourth transistor T4a is coupled to the further transistor T3b.

The MOS transistors T3a, T3b, T4a, T4b of the mixer are controlled by the gate signal GS3, GS4 with a duty cycle of 50%. (the duty cycle of the gate signal GS1-GS2 can be less than 50%), respectively and are used for the frequency conversion as described according to FIG. 4, i.e. MOS transistors T3a, T3b, T4a, T4b substantially correspond to the four transistors TA, TB, TC and TD.

The gate signals are generated such that it is prevented that output signals from different multiplier units or mixers are added destructively. A destructive summation occurs when a switch in series with the +RF input is conducting to one of the input terminals of the operational amplifier, while a further switch is present which makes a connection from the −RF input to the same input terminal. In other words, a destructive signal cancellation occurs when a connection is made from one of the RF inputs via a resistor to one of the input terminals of the operational amplifier and at the same time a further connection is made from the other the RF inputs via a resistor to the input terminals of the operational amplifier. However, according to the invention such a destructive signal cancellation does not occur in the embodiments of the invention.

This can be achieved according to the first embodiment by a modulation of the conversion gain by means of conversion gain modulation means CGU. Here, the conversion gain modulation means CGU is arranged in series with a mixer unit (with 50% duty cycle). It must be ensured that a connection between the + and − input of the RF input to a node at the output of the mixer at the same time is avoided. Instead the impedance level in series to the mixer unit is changed.

It should be noted that the gain of the frequency conversion (by switching the four transistors T3a, T3b, T4a, T4b) is proportional to the ratio between the feedback impedance of the operational amplifier OP1 and the impedance between the RF input ports and the mixer, i.e. the impedance of the conversion gain modulation means CGU. The conversion gain modulation means CGU is therefore used to modulate the impedance between the RF port and the mixer. This modulation is performed with a square wave with twice the frequency of the gate signal of the mixer, i.e. the gate signal GS1 for the first transistors T1a, T1b is twice the frequency of the gate signals for the transistors T3a, T3b, T4a, T4b. In other words, by controlling the gate signals GS1 the impedance of the conversion gain modulation means CGU and therefore also the gain of the frequency conversion is modulated. If the conversion gain modulation unit CGM is not to be used, it can be switched off by turning on the first transistors T1a, T1b and by continuously turning off the transistors T2a, T2b. This is advantageous as in such a situation power can be saved as the MOS transistors do not need to be driven.

The conversion gain modulating means CGU can also be considered as a voltage-to-current conversion unit as a voltage-to-current conversion is performed. Such a voltage-to-current conversion unit is also described later with reference to FIG. 9 and FIG. 13.

According to FIG. 4 the harmonic rejection mixer is used to modulate the conversion gain. This can be performed by switching the transistors T1a, T1b. Here, a series solution is achieved.

A calibration of the harmonic rejection unit can be performed by adjusting the delay of the switching signals GS1, GS2 and/or by adjusting the amount of gain modulation by adjusting the resistors R1, R2.

If also the down-conversion with higher LO harmonics needs to be suppressed, more harmonic rejection parts can be added in parallel as described later with respect to FIG. 9. Here, more steps are added to approach the sine wave more accurately. With such a harmonic rejection unit a more complicated and effective local oscillator shape can be realized by suppressing the down conversion of more LO harmonics.

Figure 5:
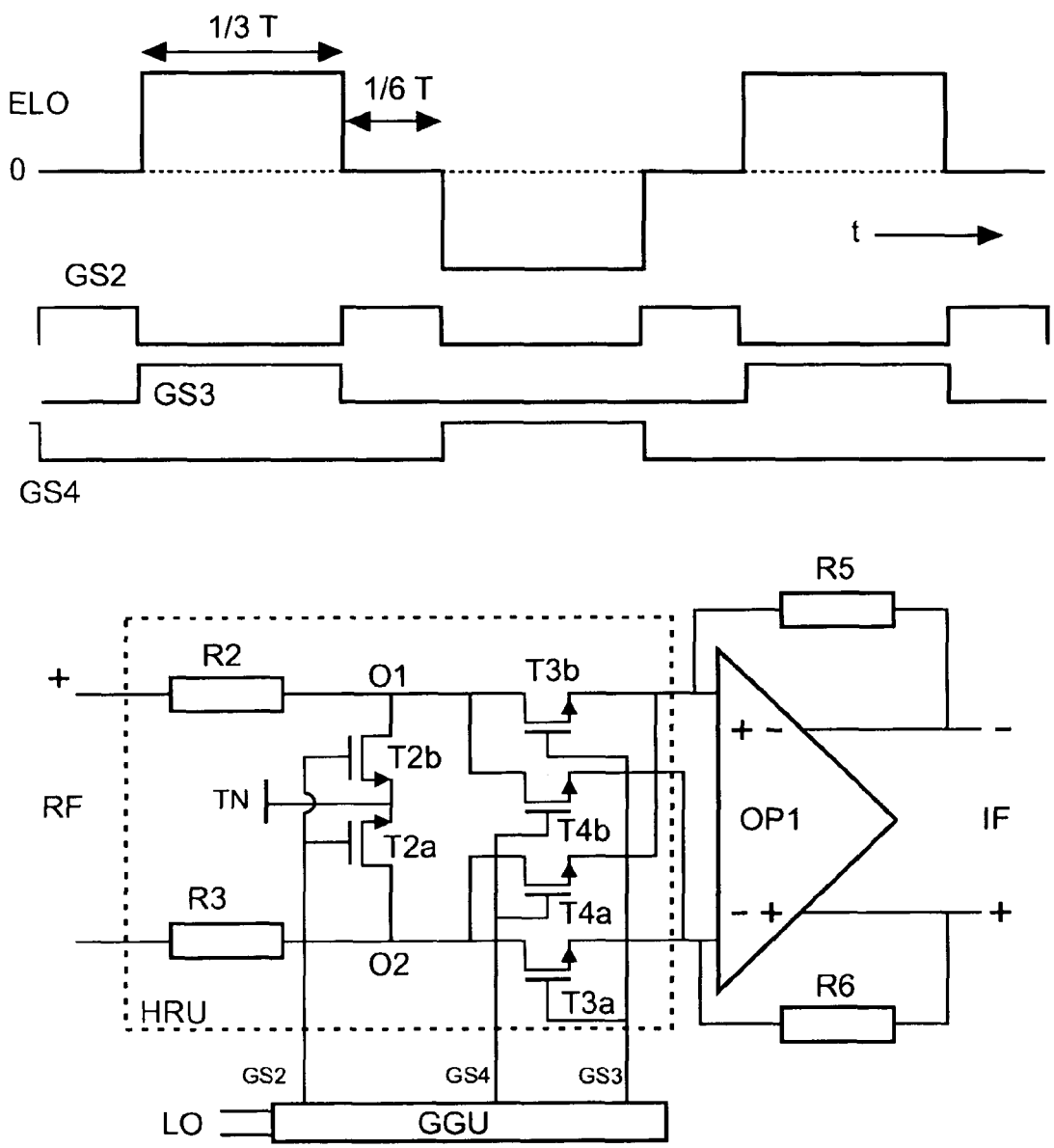
FIG. 5 shows a schematic representation of a harmonic rejection mixer according to a second embodiment.

FIG. 5 shows a schematic representation of a harmonic rejection mixer according to a second embodiment. In the upper part of FIG. 5, a diagram of the effective local oscillator LO or the multiplication signal ELO and the gate signals GS2-GS4 are depicted. The gate signals GS2-GS4 are derived from LO signal in the gate signal generating unit GGU and can be applied to different transistor units of the harmonic rejection mixer unit. The time period of the gate signal GS2 corresponds to ½ of time period of the LO signal. The time period of the gate signal GS3 corresponds to the time period of the gate signal GS4 as well as to the time period of the LO signal. However, the gate signal GS4 is time-shifted with respect to the gate signal GS3. Compared to the original 50% duty cycle of the LO signal the duty cycle of the gate signals are reduced.

In the lower part of FIG. 5, a circuit diagram of the harmonic rejection mixer according to the second embodiment is depicted. The harmonic rejection mixer according to the second embodiment substantially corresponds to the harmonic rejection mixer according to the first embodiment i.e. it also comprises a gate signal generating unit GGU. However, the fifth transistors T5, the first and fourth resistor R1, R4 are omitted and the transistors are replaced by shorts, i.e. no conversion gain modulation means is provided. In FIG. 5, a $3^{rd}$ LO harmonic rejection mixer is depicted. The effective LO or multiplication signal is adapted to introduce a zero-state as compared to the effective LO signal LO according to the first embodiment. The ON state of the effective LO signal ELO is approximately ⅓ the time period T of the LO signal. The zero-state corresponds to approximately ⅙ T. The gate signal GS2 is used to control the second transistors T2a, T2b, while the gate signals GS3, GS4 are use to control the transistors T3a, T3b, T4a, T4b (and therefore the frequency conversion). The second embodiment is advantageous with respect to the first embodiment as less switching devices (the transistors T1a, T1b are omitted) are required resulting in less silicon area and less power. Furthermore, the noise performance is also improved as the zero-state parts are not realized by the signal cancellation according to the prior art.

According to the second embodiment, the duty cycle of the gate signals GS3, GS4 has been changed such that it is not 50% anymore. Accordingly, it can occur that none of the transistors T3a, T3b, T4a, T4b of the main multiplier driven by the gate signals GS3, GS4 are ON. For such a case termination transistors T2a, T2b are added to be able to provide a defined input impedance when transistors T3a, T3b and T4a, T4b are off. Accordingly, the gate signal GS2 is high when the gate signals GS3 and GS4 are low.

In the FIGS. 4 and 5 the transistors T2a, T2b are provided to ensure the proper termination of the node N1 and N2 to the termination node TN (grid or vdd). If the other switches which are connected to the same branch are all open a proper termination of the nodes must be provided, e.g. by connecting them to ground.

In FIGS. 4 and 5, the harmonic rejection mixing unit has been implemented with MOS transistors. However, it should be noted that the harmonic rejection mixer unit according to FIGS. 4 and 5 can also be implemented based on bipolar transistors.

The first and second embodiment can be combined to realize a stepped effected LO or multiplication shape ELO as shown in FIG. 6 according to a third embodiment. This can be performed by combining the multiple conversion gain modulation means according to the first embodiment and an effective LO zero-state according to the second embodiment. Furthermore, a correct timing of the gate signals is required.

Figure 9:
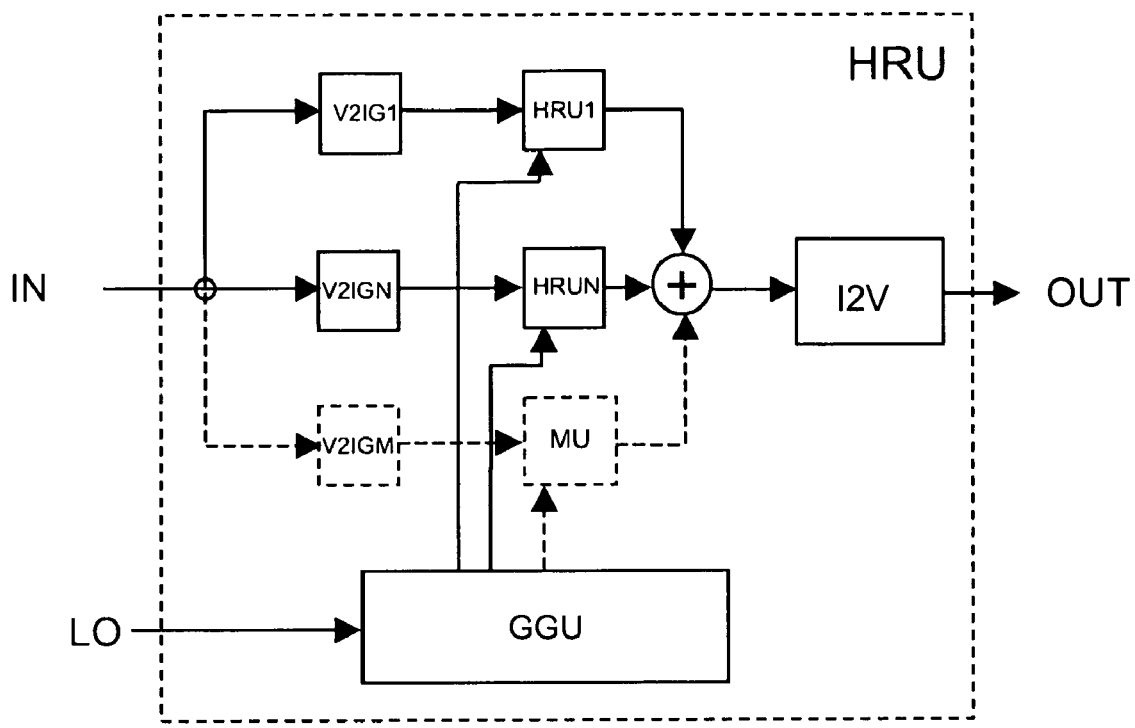
FIG. 9 shows a block diagram of a harmonic rejection mixer according to a sixth embodiment.

The effective LO or multiplication shape according to FIG. 6 can alternatively be achieved by several harmonic rejection units HRU according to the second embodiment arranged in parallel (see also FIG. 9).

The effective LO shape ELO can be decomposed into several LO signals which are the output signals of harmonic rejection units HRU, e.g. as described in FIG. 5 or FIG. 9. In other words, a harmonic rejection units HRU can be the circuit of FIG. 5 but without the operational amplifier OP1 and the resistors R5, R6. Furthermore, the respective gate signals which are required to achieve the output signals of the LO units must be generated.

Figure 13:
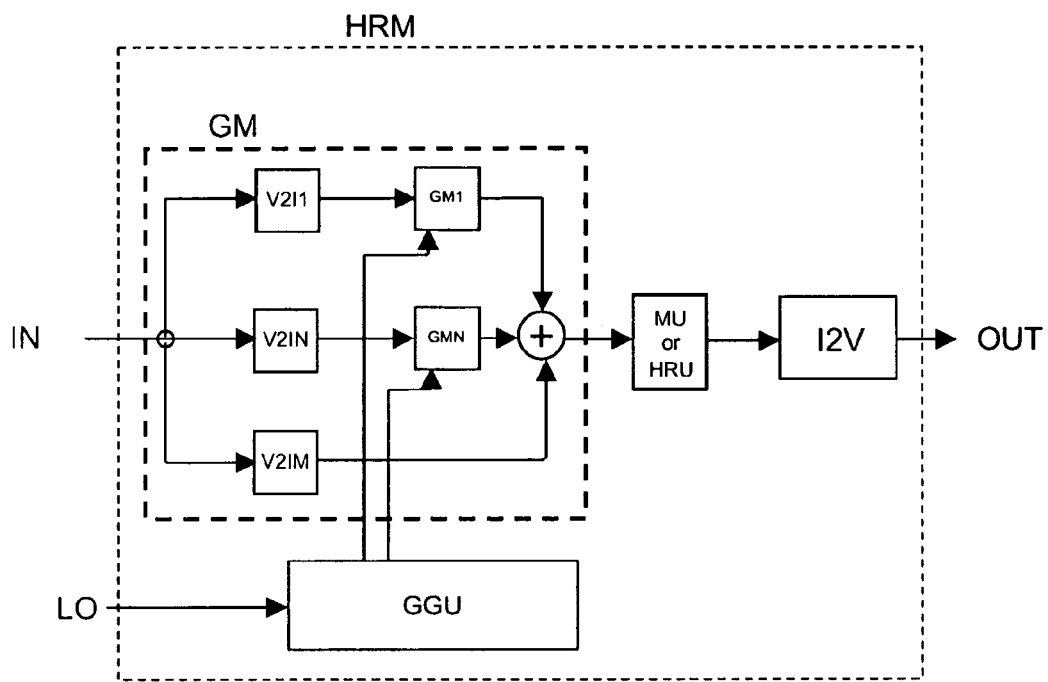
FIG. 13 shows a block diagram of a harmonic rejection mixer according to a seventh embodiment.

For every step or every additional conversion gain a summing signal is added (e.g. as depicted in FIG. 9 or 13). Each step is not achieved by a signal cancellation. In particular, the duty cycle is not 50% anymore. Every increase of the conversion gain is realized by adding a signal in parallel. In FIG. 6 it can be seen that the effective LO signal ELO is decomposed in different signals LO1-LO4 in the right hand side. The transistor control signals are generated such that it never happens that one output signal from the LO unit is +1 while the other one is of the opposite sum. The sum of the output signals from the LO units is always constructive and never destructive. A + signal is never combined with a − signal. A − signal is only combined with another − signal or with a 0 signal. A + signal is only combined with another + signal or with a 0 signal. A signal cancellation is avoided as a signal subtraction is not allowed.

The scheme according to the invention includes firstly a decomposition of the effective LO or multiplication signal ELO. While according to the prior art the effective LO signal was decomposed by time shifting signal with a duty cycle of 50%, according to the second embodiment the effective LO signal is decomposed by signals that do not have a duty cycle of 50%. Furthermore, the multiplication of the decomposed signals must be implemented by a switching circuit. In other words firstly the effective LO signal is decomposed into the signals depicted on the right hand side of FIG. 6. Thereafter, a second decomposition need to be performed to obtain the gate signals e.g. as depicted in FIG. 5.

Figure 7:
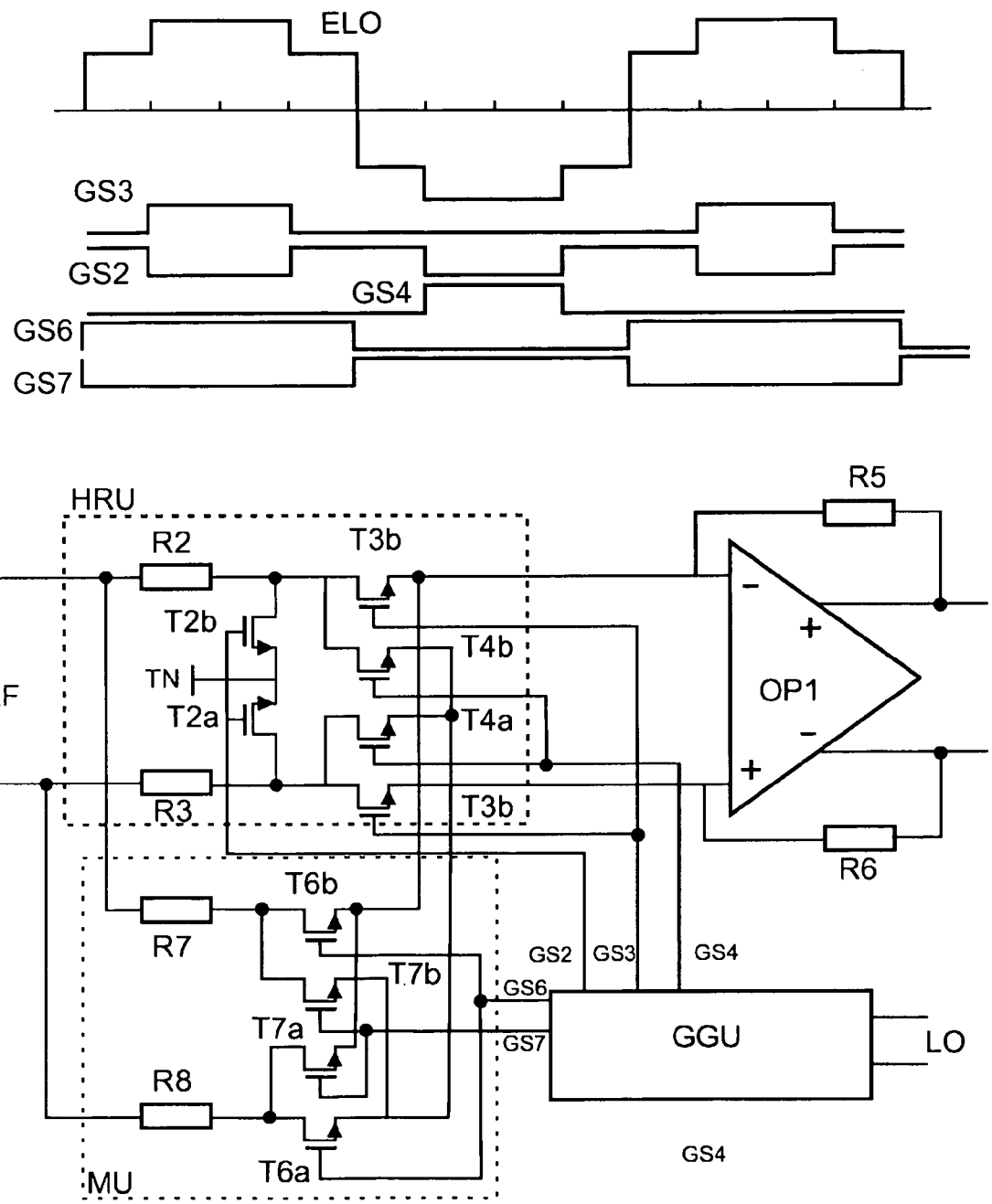
FIG. 7 shows a basic representation of a harmonic rejection mixer according to a fourth embodiment.

While according to FIG. 4 the construction of the effective LO shape is performed in a series way, the construction of the effective LO shape according to FIG. 5 or 7 is performed in a parallel way by arranging several harmonic rejection units HRU in parallel.

FIG. 7 shows a basic representation of a harmonic rejection mixer according to a fourth embodiment. The harmonic rejection mixer according to the fourth embodiment is used for $3^{rd}$ and $5^{th}$ harmonics of the LO signal. In addition to the termination transistors T2a, T2b and the transistors T3a, T3b, T4a, T4b (which are used for frequency conversion) a mixer unit MU with a further set of four transistors T6a, T6b, T7a, T7b with two resistors R7, R8 are provided which are coupled in parallel to the transistors T3a, T3b, T4a, T4b and the resistors R2, R3. The gate signal GS2 controls the gates of the second transistors T2a, T2b. The gate signal GS3 and GS4 control the gates of the third and fourth transistors T3a, T3b and T4a, T4b, respectively. The gate signal GS6 and GS7 control the gates of the sixth and seventh transistors T6a, T6b and T7a, T7b, respectively. The time period of the second gate signal GS2 is ½ of the time period of gate signal GS3, GS4, GS6, GS7. The time periods of the third, fourth, sixth and seventh gate signal. GS3, GS4, GS6, GS7 can correspond to the time period of the LO signal. The seventh gate signal GS7 is inverted to the sixth gate signal GS6.

Figure 1:
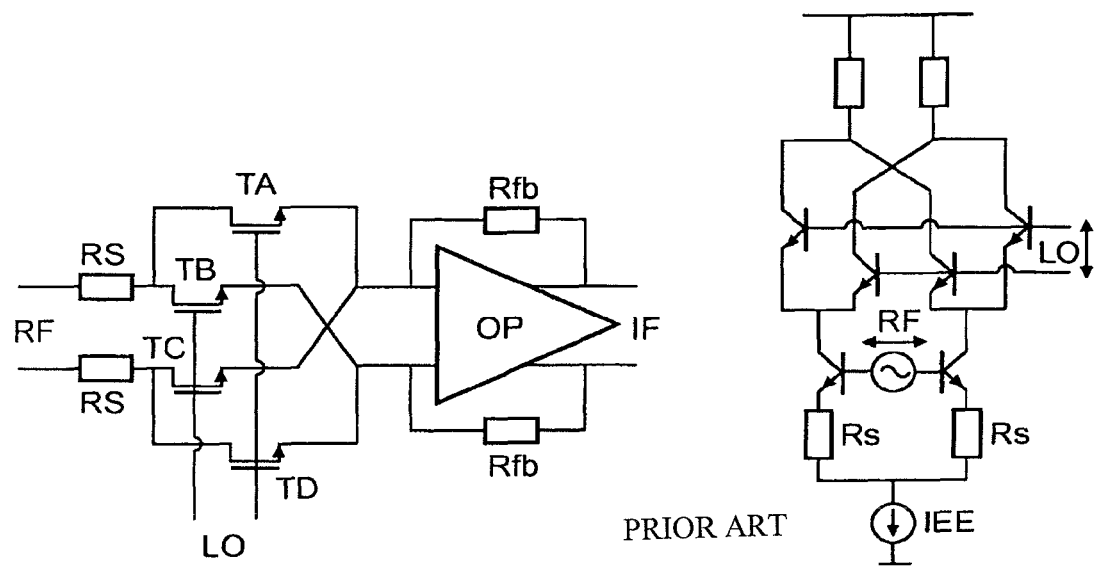
FIG. 1 shows a circuit diagram of a switching MOS mixer and a Gilbert cell mixer according to the prior art.
Figure 2:
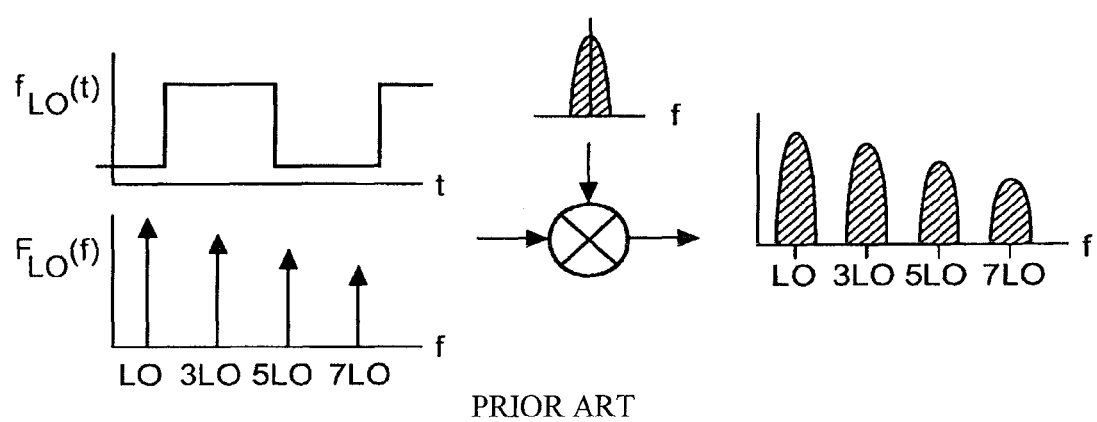
FIG. 2 shows a basic representation of a square wave multiplication of an up-conversion mixer according to the prior art.
Figure 3:
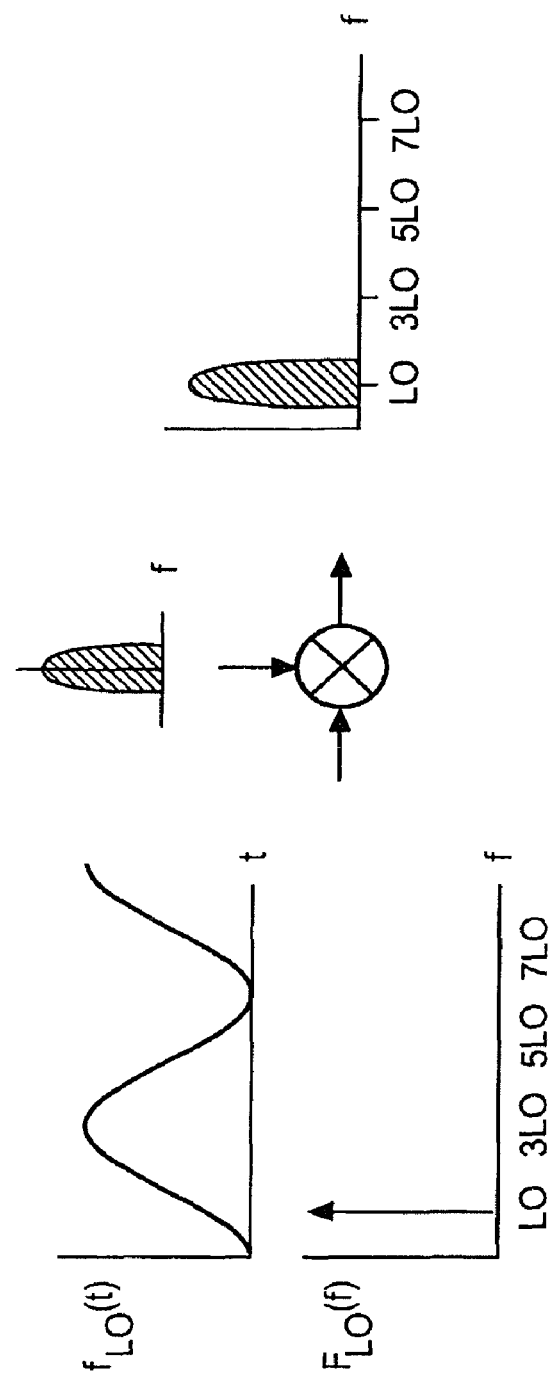
FIG. 3 shows a representation of a linear multiplying in an up-conversion mixer.

According to the fourth embodiment to achieve a desired effective LO signal ELO a basic switching stage according to FIG. 1 with a classical mixer unit MU can be combined with harmonic rejection units HRU according to FIG. 5. The fourth embodiment is advantageous as no switches are arranged in series with the signal path. Here, smaller LO signal drivers are required and therefore less power consumption as the linearity of the passive MOS switching stage is proportional to the ratio of the series resistor and the resistor $R_{on}$ of the switches in series. The duty cycle of the gate signal GS3, GS4 is less than 50%. Therefore, the transistors T2a, T2b are introduced as described above.

Figure 8:
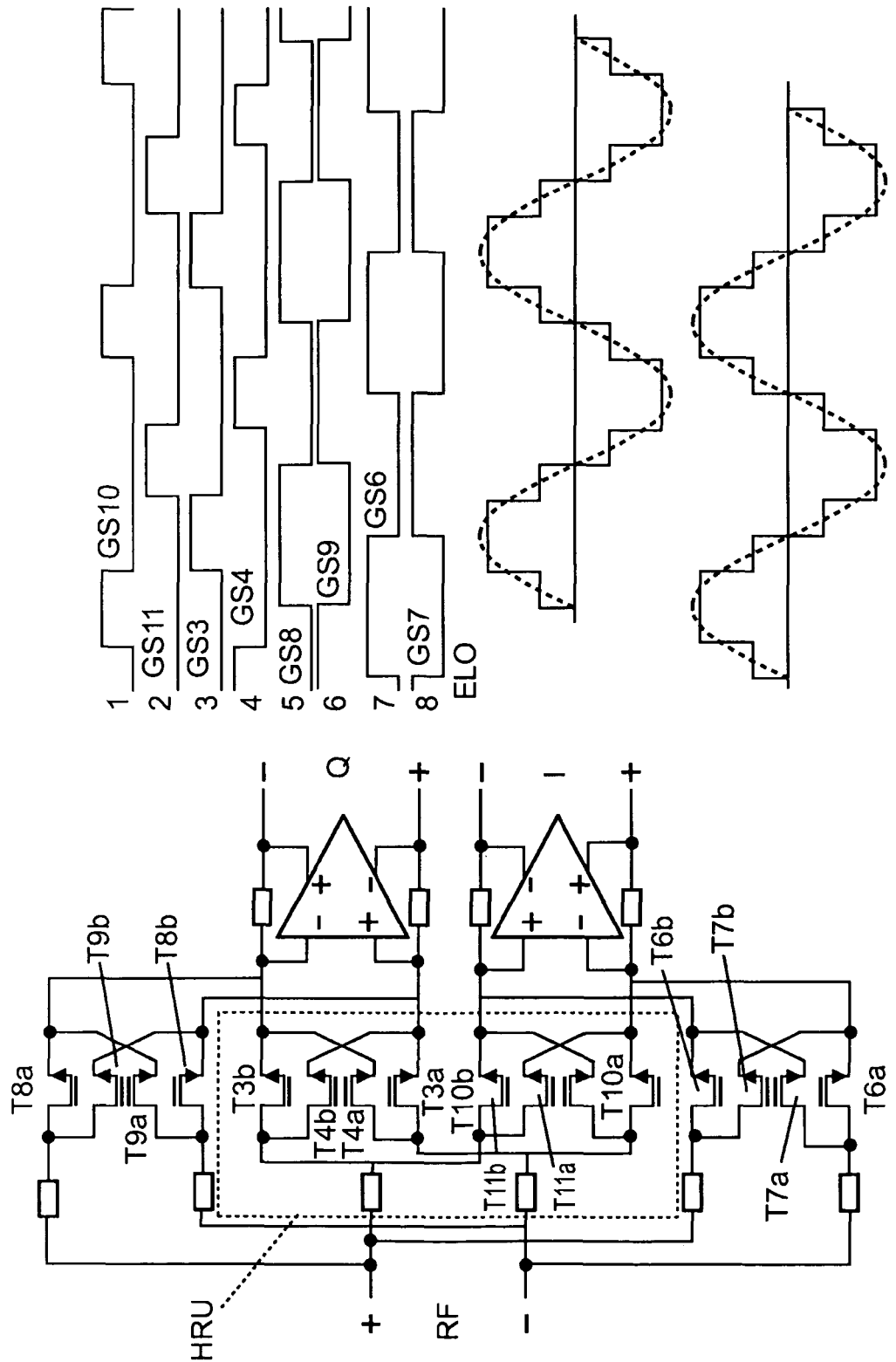
FIG. 8 shows a basic representation of a harmonic rejection mixer according to a fifth embodiment.

FIG. 8 shows a basic representation of a harmonic rejection mixer according to a fifth embodiment. The harmonic rejection mixer according to the fifth embodiment constitutes a quadrature mixer based on the harmonic rejection mixer according to the fourth embodiment. Here, the second transistors T2a, T2b which are coupled to ground can be omitted and the two resistors R2, R3 can be shared. While the harmonic rejection mixer according to FIG. 7 comprises two sets of four transistors for the frequency conversion, the harmonic rejection mixer according to FIG. 8 comprises four sets of four transistors T3a, T3b, T4a, T4b; T6a, T6b, T7a, T7b; T8a, T8b, T9a, T9b; T10a, T10b; T11a, T11b for the frequency conversion. The gate signals GS1-GS11 for controlling the transistors in the four sets are depicted in the upper right corner of FIG. 8.

In FIG. 8 a special embodiment is depicted. The duty cycle is 25% therefore the series resistor of the harmonic rejection can be shared and no terminal transistors (T2a, T2b) to ground or virtual ground are required.

In the quadrature mixer the input signal undergoes two multiplications, namely one in-phase and a 90° phase shifted multiplication such that an I- and a Q-part is present. If in the Q-path the transistors that are coupled to ground are ON, i.e. the switches are closed. The respective switches are open in the I part of the mixer. When in the Q path the transistors of the harmonic rejection unit HRU are open, the corresponding transistors in the I path are closed.

The gate signal generating unit GGU (not shown in FIG. 8) receives the local oscillator signal LO as input signal and outputs the required gate signals GS1-GS11. The respective gate signal are then supplied to the gates of the transistors. The local oscillator signal LO should be higher than the frequency of the effective LO signal to provide sufficient rising and falling edges to derive the gate signals.

In FIG. 8 the termination transistors are removed and a voltage-to-current V2I conversion unit V2I (here the V2I conversion resistor) is shared between the I and Q-part of the mixer.

FIG. 9 shows a block diagram of a harmonic rejection mixer according to a sixth embodiment. While in FIG. 5 a circuit diagram of the harmonic rejection mixer is depicted, FIG. 9 shows a block diagram of the harmonic rejection mixer. The harmonic rejection mixer comprises an input TN, a plurality of voltage-to-current units with different gain V2IG1-V2IGN, coupled to the input IN and in series with a plurality of harmonic rejection units HRU1-HRUN (wherein each V2I unit is associated with a harmonic rejection unit HRU) and a current to voltage unit I2V. The outputs of the harmonic rejection units HRU1-HRUN are summed or combined and the result thereof is input to the current-to-voltage unit I2V. The output of the current to voltage unit I2V constitutes the output of the harmonic rejection mixer. The harmonic rejection mixer furthermore comprises a transistor control signal generating unit GGU for generating transistor control signals for controlling transistors in the harmonic rejection units HRU1-HRUN. Optionally, the harmonic rejection mixer comprises a further voltage-to-current unit V2IM coupled in series to a mixer unit (which may constitute a classical mixer unit for mixing an input signal with a second signal like a LO signal). If the harmonic rejection mixer according to FIG. 9 is implemented with MOS transistors, than the transistor control signals are gate signals (for example please also refer to FIGS. 4 and 5). The harmonic rejection units according to FIG. 9 can be implemented as depicted in FIG. 4 or FIG. 5. The voltage to current conversion units V2IG1-V2IN can for example be implemented as the conversion gain modulating means according to FIG. 4. With the harmonic rejection units arranged in parallel the stepped shape of the multiplication signal according to FIG. 6 can be achieved.

Figure 10A:
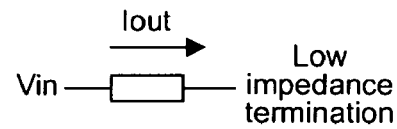
FIGS. 10a to 10c show schematic circuit diagrams for different implementations of a voltage-to-current unit of FIG. 9.
Figure 10B:
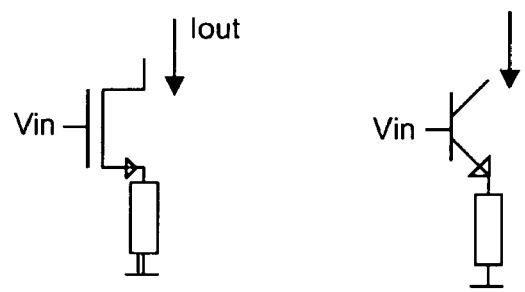
Figure 10C:
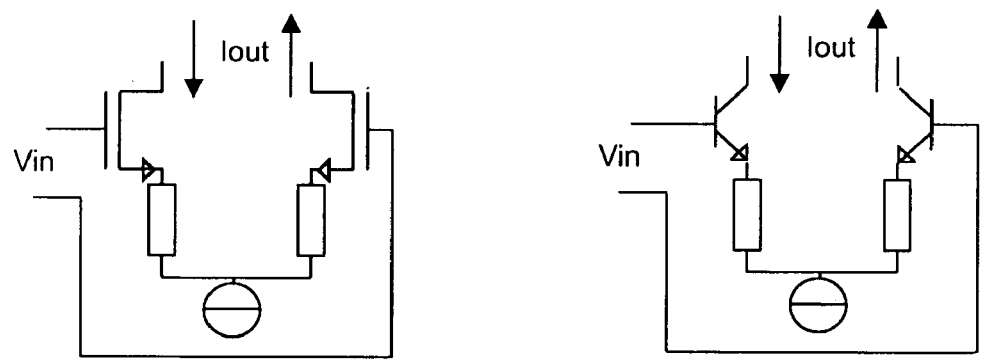

FIGS. 10a to 10c show schematic circuit diagrams for different implementations of a voltage-to-current unit of FIG. 9. In FIG. 10a the voltage-to-current unit is implemented as a resistor with a low impedance termination (e.g. the resistors R2, R3 in FIG. 4). In FIG. 10b the voltage-to-current unit is implemented—for a single-ended implementation of the harmonic rejection mixer—as a MOS or bipolar transistor. In FIG. 10c the voltage-to-current unit is implemented—for a balanced implementation of the harmonic rejection mixer—as a two MOS or bipolar transistors each with a resistor which are coupled to a current source.

Figure 11A:
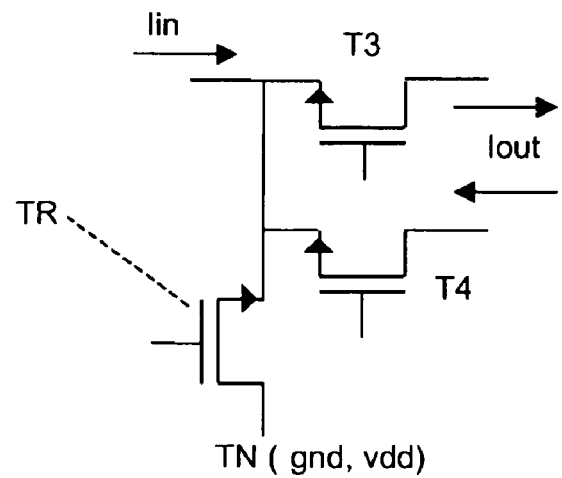
FIG. 11a and 11b show a basic circuit diagram of a single-ended and a balance implementation of a harmonic rejection unit.
Figure 11B:
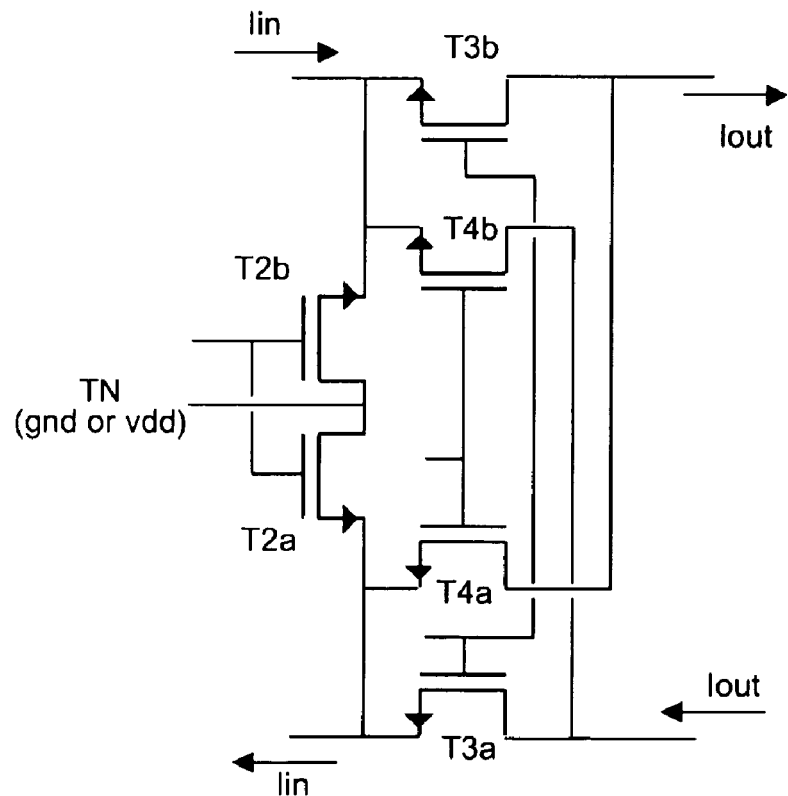

FIG. 11a and 11b show a basic circuit diagram of a single-ended and a balanced implementation of a harmonic rejection unit according to FIG. 9. In FIG. 11a a single-ended implementation of the harmonic rejection unit HRU is depicted. Here, two transistors T3, T4 (the mixer) and a termination transistor TR are shown. In FIG. 11b a balanced implementation of the harmonic rejection unit HRU is depicted. Here, four transistors T3a, T3b, T4a, T4b (which may correspond to the transistors T3a, T3b, T4a, T4b in the previous embodiments) and two termination transistor T2a, T2b (which may correspond to the transistors T2a, T2b in the previous embodiments) are shown.

The drains and sources of the transistors can be interchanged for a passive implementation. MOS transistors can be replaced by bipolar transistors. N-type devices can be replaced by P-type devices. The forward transistor control signals may have a duty cycle of <50%. The control signal for the termination transistors may have a frequency which is twice as high as the frequency of the other forward control signals.

If several harmonic rejection units HRU are present (e.g. according to FIG. 9) and if the termination is never activated for more than one harmonic rejection unit HRU at the same time and if these harmonic rejection units are connected to V2I units that have identical gain settings, then a single V2I unit can be connected to all of these harmonic rejection units HRU. All termination transistors in these units can then be removed if always 1 harmonic rejection units HRU is activated. All termination transistors in these units can then be replaced by a single termination unit in all other cases.

Figure 12A:
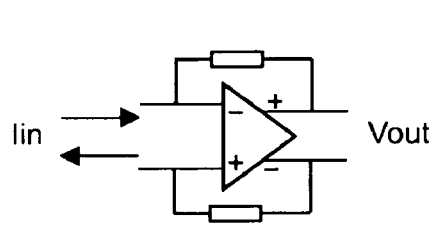
FIGS. 12a and 12b show basic circuit diagrams of a current-to-voltage unit according to FIG. 9.
Figure 12B:
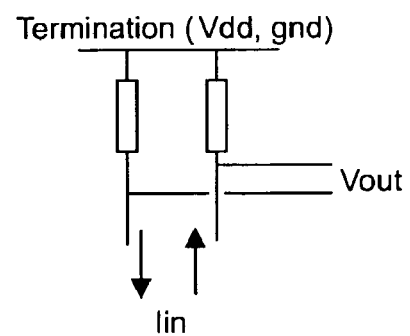

FIGS. 12a and 12b show basic circuit diagram of a current-to-voltage unit according to FIG. 9. In FIG. 12a the current-to-voltage unit is implemented as a trans-impedance amplifier TIA. In FIG. 12b the current-to-voltage unit is implemented with two resistors.

FIG. 13 shows a block diagram of a harmonic rejection mixer HRM according to a seventh embodiment. The harmonic rejection mixer comprises a gain modulation unit GM (which may correspond to the conversion gain modulation means CGU according to FIG. 4), coupled in series to a classical mixer unit MU or a harmonic rejection unit HRU. A current-to-voltage unit I2V is coupled to the output of the mixer unit MU or the harmonic rejection unit. The harmonic rejection mixer furthermore comprises a transistor control signal generating unit GGU for generating transistor control signals for controlling some of the transistors in the gain modulation unit GM. The gain modulation unit GM comprises at least one voltage-to-current gain unit V2I1-V2IN, V2IM, at least one gain modulation unit GMI-GMN and a summation unit for summing the outputs of the gain modulation units and the output of the voltage-to-current unit V2IM. The gain modulation units GMI-GMN may correspond to the conversion gain modulation unit CGM and the voltage-to-current unit V2I may correspond to the resistors R2, R2 in FIGS. 4 and 5. The voltage-to-current gain unit V2IG of FIG. 9 may correspond to the gain modulation unit GM according to FIG. 13.

If for several gain modulation units GM the termination is never activated for more than one GM unit at the same time and if these gain modulation units GM are connected to V2I units that have identical gain settings, then a single V2I unit can be connected to all these gain modulation units GM. All termination transistors in these units can then be removed if always 1 gain modulation units GM unit is activated. All termination transistors in these units can then be replaced by a single termination unit in all other cases.

Preferably, the gate signals should be centered at the middle of the effective LO shape to be able to achieve an effective LO shape as depicted in FIG. 4. Alternatively the gate signal can be generated such that they are not centered at the middle of the effective LO shape.

The invention relates to the idea that output signal from different multiplier units or transistor units are added non-destructively. This can be done by performing a conversion gain modulation, i.e. a circuit is arranged in series with a multiplier. Alternatively, this can be performed by selecting a duty cycle which is less than 50% rejecting $3^{rd}$ harmonics. Moreover, a number of transistor units can be arranged in parallel (e.g. as shown in FIG. 5), wherein each unit comprises a weight or conversion gain. By means of the harmonic rejection mixer a sample-and-hold circuit is approached.

Although in the above embodiments balanced mixers have been described, the principles of the invention can also be applied to single-ended mixers which only require halve the number of transistors.

As mentioned above, more harmonic rejection parts can be added to the circuit with different conversion gains and more steps of the LO signal may also be added.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be constrained as limiting the scope of the claims.

The invention claimed is:
1. Harmonic rejection mixer unit, comprising
an input;
at least one harmonic rejection unit with at least two transistor units for multiplying an input signal from the input with a multiplication signal; and
a transistor control signal generating unit for generating transistor control signals for the at least two transistor units of the at least one harmonic rejection unit by deriving the transistor control signals (GS1-GS4) from a local oscillator signal, wherein the transistor control signals for the at least two transistor units are generated with a duty cycle of <50% and are generated such that the shape of the multiplication signal is achieved by a constructive summation of the output signals from the transistor units, wherein the transistor control signals are generated such that only a summation of output signals from the transistor units with the same sign or with zero is performed.

2. Harmonic rejection mixer unit according to claim 1, further comprising
a termination transistor unit for providing a termination of the at least two transistor units in the at least one harmonic rejection unit to a termination node, if the at least two transistor units are switched off.

3. Harmonic rejection mixer unit according to claim 1, wherein
the transistor control signal generating unit is adapted to generate transistor control signals for the termination transistor units by deriving the transistor control signals from the local oscillator signal, wherein the frequency of the transistor control signal is twice the frequency of the transistor control signal for the at least two transistor units.

4. Harmonic rejection mixer unit according to claim 1, wherein
in a balanced implementation each transistor unit comprises at least two transistors.

5. Harmonic rejection mixer unit according to claim 1, wherein
in a single-ended implementation each transistor unit comprises at least one transistor.

6. Harmonic rejection mixer unit according to claim 1, comprising
at least one mixer unit arranged in parallel to the at least one harmonic rejection unit and comprising at least two transistor unit,
wherein the transistor control signals for the at least two transistor units at the mixer unit generated by the transistor control signal generating unit have a duty cycle of approximately 50%.

7. Harmonic rejection mixer unit according to claim 1, further comprising:
a conversion gain modulation means, coupled in series with the at least one harmonic rejection unit, and comprising at least one conversion gain modulation unit for performing a voltage-to-current conversion and for modulating the gain of the voltage-to-current conversion whereby modulating the conversion gain of the harmonic rejection mixer unit.

8. Harmonic rejection mixer unit according to claim 1, wherein
at least two harmonic rejection units are arranged in parallel.

9. Harmonic rejection unit according to claim 1, wherein
if for a plurality of harmonic rejection units a termination unit is not activated for more than one of the harmonic rejection units at the same time and if these harmonic rejection units are coupled to a conversion gain modulation unit with identical gain settings, then a single conversion gain modulation unit can be coupled to all of the harmonic rejection units.

10. Electronic device, comprising at least one harmonic rejection mixer unit according to claim 1.

11. Harmonic rejection mixer unit, comprising
an input;
at least one mixer unit with at least two transistor units for mixing an input signal from the input,
a conversion gain modulation circuit, coupled in series with the at least one mixer unit, and comprising at least one conversion gain modulation unit for performing a voltage-to-current conversion and for modulating the gain of the voltage-to-current conversion, thereby modulating the conversion gain of the harmonic rejection mixer unit, and
a transistor control signal generating unit for generating transistor control signals for the at least two transistor units by deriving the transistor control signals from a local oscillator signal.

12. Harmonic rejection mixer unit according to claim 10, wherein
the conversion gain modulation unit comprises
a first resistor coupled between the input and a first node;
a second resistor coupled between the input and a second node;
a transistor coupled in series with the first node;
a transistor coupled in series with the second node;
wherein a termination transistor is coupled between the first node and a termination node and wherein a further termination transistor is coupled between the second node and the termination node;
wherein the transistor control signals for the transistors are generated by the transistor control signal generating unit such that the gain of the voltage-to-current conversion performed by the conversion gain modulation circuit is modulated.

13. Harmonic rejection mixer unit according to claim 11, wherein
the transistor control signal for the transistors are generated by the transistor control signal generating unit with a frequency that is twice the frequency of the transistor control signal for the at least two transistor units.

14. Harmonic rejection mixer unit according to claim 11, wherein
the conversion gain modulation means comprises a plurality of conversion gain modulation units coupled in parallel.

15. Harmonic rejection mixer unit according claim 10, wherein
if a termination unit is not activated for more than one conversion gain modulation units in a plurality of gain modulation units at the same time and if these conversion gain modulation units are connected to voltage-to-current conversion units with identical gain settings, then a single voltage-to-current conversion unit can be coupled to all of the conversion gain modulation units.

16. Method for performing a harmonic rejection mixing, comprising the steps of:
multiplying an input signal from the input with a multiplication signal by at least one harmonic rejection unit with at least two transistor units; and
generating transistor control signals for the at least two transistor units of the at least one harmonic rejection unit by deriving the transistor control signals from a local oscillator signal by means of a transistor control signal generating unit;
generating the transistor control signals for the at least two transistor units with a duty cycle of <50%; and
generating the transistor control signals such that the shape of the multiplication signal is achieved by a constructive summation of the output signals from the transistor units, wherein the transistor control signals are generated such that only a summation of output signals from the transistor units with the same sign or with zero is performed.

17. Method for performing a harmonic rejection mixing, comprising the steps of:

mixing an input signal from the input by means of at least one mixer unit with at least two transistor units, performing a conversion gain modulation by means of a conversion gain modulation means, coupled in series with the at least one mixer unit, by performing a voltage-to-current conversion and by modulating the gain of the voltage-to-current conversion whereby modulating the conversion gain of the harmonic rejection mixer unit, and generating transistor control signals for the transistor units by deriving the transistor control signals from a local oscillator signal by means of a transistor control signal generating unit.

* * * * *